United States Patent [19]
Kasamoto

[11] Patent Number: 5,379,174
[45] Date of Patent: Jan. 3, 1995

[54] SEMICONDUCTOR PROTECTING APPARATUS AND METHOD FOR PREVENTING DESTRUCTION OF INTERNAL CIRCUIT CAUSED BY LATCH-UP

[75] Inventor: Masayuki Kasamoto, Hyogo, Japan

[73] Assignee: Mitsubishi Denki Kabushiki Kaisha, Tokyo, Japan

[21] Appl. No.: 912,368

[22] Filed: Jul. 13, 1992

[30] Foreign Application Priority Data

Sep. 29, 1991 [JP] Japan .................................. 3-247391

[51] Int. Cl.$^6$ ............................................. H02H 9/02
[52] U.S. Cl. ........................................ 361/56; 361/18; 361/86; 361/91
[58] Field of Search ................ 361/91, 57, 93, 56, 361/86, 87, 18

[56] References Cited

U.S. PATENT DOCUMENTS 4,594,633  6/1986  Townsend et al. .................... 361/57
4,791,316 12/1988  Winnerl et al. ........................ 361/86

Primary Examiner—Marc S. Hoff
Assistant Examiner—S. Jackson
Attorney, Agent, or Firm—Lowe, Price, LeBlanc & Becker

[57] ABSTRACT

In a semiconductor integrated circuit device including a substrate bias voltage generating circuit supplying a substrate bias voltage to internal circuit performing original functions and a substrate where the internal circuit is formed, an N channel MOS transistor is provided between the internal circuit and power supply pad receiving an external voltage Vcc for driving the circuit. The transistor is controlled such that it is rendered conductive when substrate potential $V_{SB}$ is higher than the threshold voltage of MOS transistor and non-conductive when potential $V_{SB}$ is lower than the threshold voltage. Since supply of power supply voltage Vcc to the internal circuit is interrupted if latch-up is caused in the internal circuit and substrate potential $V_{SB}$ rises, internal circuit is immediately freed from the latch-up state even if latch-up is caused. Therefore, the internal circuit is protected from being heated or destructed by a current due to the latch-up.

21 Claims, 5 Drawing Sheets

SEMICONDUCTOR PROTECTING APPARATUS AND METHOD FOR PREVENTING DESTRUCTION OF INTERNAL CIRCUIT CAUSED BY LATCH-UP

BACKGROUND OF THE INVENTION

1. Field of the Invention

The present invention relates generally to a semiconductor protecting apparatus and, more particularly to a semiconductor protecting apparatus and a method for preventing destruction of a semiconductor device caused by latch-up.

2. Description of the Background Art

In a semiconductor integrated circuit device of a CMOS structure, N type regions and P type regions forming elements of transistors and the like which are to be originally incorporated therein equivalently forms elements other than these elements. The elements formed equivalently are so-called parasitic thyristor element parasitizing the original elements.

It is known that a phenomenon called latch-up allowing large current to flow between power supply terminals is caused by operation of such parasitic thyristor elements in a conventional semiconductor integrated circuit device. Referring to FIG. 5, latch-up will be briefly described.

FIG. 5 is a diagram showing an example of a sectional structure of a semiconductor integrated circuit device of a CMOS structure.

A P type substrate 100 having a low impurity concentration comprises a region where an N channel MOS transistor is formed and a region where a P channel MOS transistor is formed on a main surface.

The N channel MOS transistor comprises N type regions 700 and 800 formed on P type substrate 100 as a drain and a source, respectively, and a gate electrode 900 formed above the substrate 100 with an insulating film interposed and between N type regions 700 and 800.

The P channel MOS transistor is formed in an N well 200 formed on P type substrate 100. The P channel MOS transistor comprises P type regions 400 and 500 formed on an N well 200 as a source and a drain, respectively, and a gate electrode 600 formed above the substrate 100 with an insulating film interposed and between p type regions 400 and 500 on N well 200.

On N well 200, an N type region 300 having an N type impurity concentration higher than that of N well 200 is formed in order to apply a back gate voltage to the P channel MOS transistor.

Similarly, on P type substrate 100, a P type region 150 having a P type impurity concentration higher than that of P type substrate 100 is formed in order to apply the back gate voltage to the N channel MOS transistor.

Power supply voltage Vcc is applied to N type region 300 and P type region 400. A ground potential Vss is applied to N type region 800 and P type region 150.

When the potential of N type region 700 falls below ground potential Vss, a PN junction formed of N type region 700 and P type substrate 100 is brought into a forward biased state and electrons flow out of N type region 700 into P type substrate 100. These electrons flow into N well 200 having a high potential and reach N type region 300. That is, a current flows from N type region 300 to N type region 700 through N well 200 and P type substrate 100.

When a PN junction formed of P type region 400 and N well 200 is brought into a forward biased state by a voltage drop caused in N well 200 by the current, holes flow out of P type region 400 into N well 200. These holes flow out of N well 200 to N type region 800 having a low potential through P type substrate 100. That is, a current flows from P type region 400 to N type region 800 through N well 200 and P type substrate 100.

The current increases a forward voltage, which is applied to the PN junction formed of N type region 700 and P type substrate 100, so that more electrons flow out N type region 700 into P type substrate 100. Therefore, as long as power supply voltage Vcc and ground potential Vss are applied to P type region 400 and N type region 300, and N type region 800 and P type region 150, respectively, more current flows from P type region 400 to N type region 800 through N well 200 and P type substrate 100 according to the above-mentioned mechanism.

P type region 400 is connected to power supply pad 250 receiving external power supply voltage Vcc through an interconnection 350 formed of metal such as aluminum. N type region 800 is connected to a ground pad 450 receiving external ground potential Vss through an interconnection 550 formed of metal such as aluminum.

In practice, interconnections 350 and 550, and power supply pad 250 and ground pad 450 are provided in the periphery of P type substrate 100 in order to supply the external power supply voltage to circuitry formed on P type substrate 100.

In order to prevent latch-up, a method has been used in which the potential of P type substrate 100 is kept lower than ground potential Vss by applying a negative voltage to P type substrate 100. This voltage with which the substrate is biased in order to prevent latch-up is termed a substrate bias voltage $V_{BB}$. The substrate bias voltage $V_{BB}$ is applied to the substrate through an impurity region formed on the substrate and having the same conductivity type as the substrate.

Such a substrate bias voltage $V_{BB}$ is generally generated within a semiconductor integrated circuit device. Because of that, a conventional semiconductor integrated circuit device is provided with a substrate bias voltage generating circuit 12 for generating substrate bias voltage $V_{BB}$ formed on the same semiconductor substrate as the other circuit portions are formed.

However, even applying such a substrate bias voltage can not prevent latch-up completely.

As described above, in a conventional semiconductor integrated circuit device, a circuit formed on a semiconductor substrate is directly connected to a power supply pad and a ground pad receiving an external power supply voltage for driving the circuit through an interconnection of metal such as aluminum. Hence, once latch-up is caused as described above, the latch-up state is maintained unless the external power supply continues to be applied to the device.

For example, referring to FIG. 5, when a power is supplied externally, current is constantly supplied to p type region 400 from power supply pad 250 and current is constantly drawn out from N type region 800 to ground pad 450, so that the potential of N type region 700 is below ground potential Vss. Consequently, as described above, once current starts to flow from P type region 400 to N type region 800 through N well 200 and P type substrate 100, the current keeps flowing from power supply pad 250 to ground pad 450 through interconnection 350, P type region 400, N well 200, P type substrate 100, N type region 800, and interconnection 550.

If such large current keeps flowing in a semiconductor integrated device, then the semiconductor integrated circuit chip is heated by the current and eventually the whole circuit formed on the chip is destroyed.

SUMMARY OF THE INVENTION

An object of the present invention is to provide a semiconductor protecting device capable of protecting a semiconductor device from destruction by continuation of a latch-up state.

Another object of the present invention is to provide a semiconductor protecting apparatus capable of avoiding the continuation of a latch-up state in a semiconductor device.

Yet another object of the present invention is to provide a semiconductor protecting device preventing a large current due to latch-up from keeping flowing in a semiconductor substrate.

Still another object of the present invention is to provide a semiconductor integrated circuit device in which destruction of an internal circuit due to latch-up is avoided.

Another object of the present invention is to provide a semiconductor integrated circuit device in which a large current due to latch-up does not keep flowing in a semiconductor substrate.

According to one aspect, a semiconductor protecting apparatus according to the present invention includes a potential detecting circuit detecting a potential of a semiconductor substrate being higher than a predetermined potential, and a voltage supply interrupting circuit interrupting supply of a predetermined external voltage a semiconductor integrated circuit in response to a detection output of the potential detecting circuit so as to protect the semiconductor integrated circuit to be driven by the predetermined external voltage for operating from an influence of continuation of latch-up caused in the semiconductor substrate.

According to another aspect, a semiconductor integrated circuit device of the present invention includes a circuit to be driven by a predetermined external voltage for operating and a protecting circuit for protecting the circuit from an influence due to continuation of latch-up caused in a semiconductor substrate, both being formed on the same semiconductor substrate. The protecting circuit includes a potential detecting circuit detecting a potential of the semiconductor substrate being higher than a predetermined potential and a voltage supply interrupting circuit interrupting supply of a predetermined external voltage to the semiconductor integrated circuit in response to a detection output of the potential detecting means.

Preferably, the substrate potential detecting circuit includes an external terminal receiving the external voltage; a first node electrically connected to the external terminal; and a first switching circuit electrically connecting the first node to a predetermined low potential source when a potential of the semiconductor substrate is in a first range, and electrically cutting off the first node from the predetermined low potential source when the potential of the semiconductor substrate is in a second range. A potential of the first node is used as the detection output. In this case, preferably, the voltage supply interrupting circuit includes a second switching circuit connected between an external terminal and the circuit to be driven by the predetermined external voltage and turning on/off in response to the potential the first node.

If the second switching circuit includes an NMOS transistor having a drain connected to the external terminal, a source connected to the circuit to be driven by the predetermined external voltage and a gate connected to the first node, the voltage supply interrupting circuit further includes a potential controlling circuit lowering a potential of the gate in response to a rise of the potential of the first node and raising the potential of the gate in response to a fall of the potential of the first node, and a capacitance coupling element which is charged during a time period when the potential of the node 1 is in the first range is connected to a second node.

According to a further aspect, the present invention is directed to a method for protecting a circuit driven by a predetermined external voltage for operating and formed on a semiconductor substrate from an influence of latch-up caused in a semiconductor substrate. The method includes the steps of generating a predetermined detection signal following a detection of a potential of the semiconductor substrate being higher than a predetermined potential, and interrupting supply of a predetermined external voltage to the circuit in response to the generated detection signal.

The semiconductor protecting apparatus and the semiconductor integrated circuit device are structured as described above, and the protecting method includes the above steps according to the present invention, so that the predetermined external voltage is supplied to the circuit driven by the predetermined external voltage to operate formed on a semiconductor substrate only when the potential of the semiconductor substrate is a predetermined potential or below.

Therefore, for example, when the potential of the semiconductor substrate changes from a potential which is a potential lower than the predetermined potential to a potential higher than the predetermined potential and thereafter returns to the potential lower than the predetermined potential, the predetermined external voltage is applied to the circuit until the potential of the semiconductor substrate exceeds the predetermined potential; however when the potential of the semiconductor substrate exceeds the predetermined potential, the predetermined external voltage is not supplied to the circuit. Thereafter in response to a fall of the potential of the semiconductor substrate to the predetermined potential, the predetermined external voltage starts to be supplied again to the circuit.

Therefore, according to the present invention, since supply of driving voltage to the circuit in which latch-up is caused is interrupted in response to latch-up, a current due to the latch-up cannot keep flowing in the substrate where the circuit is formed. As a result, the circuit is protected from being heated or destructed by keeping the circuit in the latch-up state. Furthermore, according to the present invention, when the circuit is freed from the latch-up state, supply of power supply voltage to the circuit is automatically resumed. And hence, it is possible to operate the internal circuit of the semiconductor integrated circuit device while automatically protecting the circuit from heated or destructed by latch-up.

The foregoing and other objects, features, aspects and advantages of the present invention will become more apparent from the following detailed description of present invention when taken in conjunction with the accompanying drawings.

DESCRIPTION OF THE PREFERRED EMBODIMENTS

Figure 1:
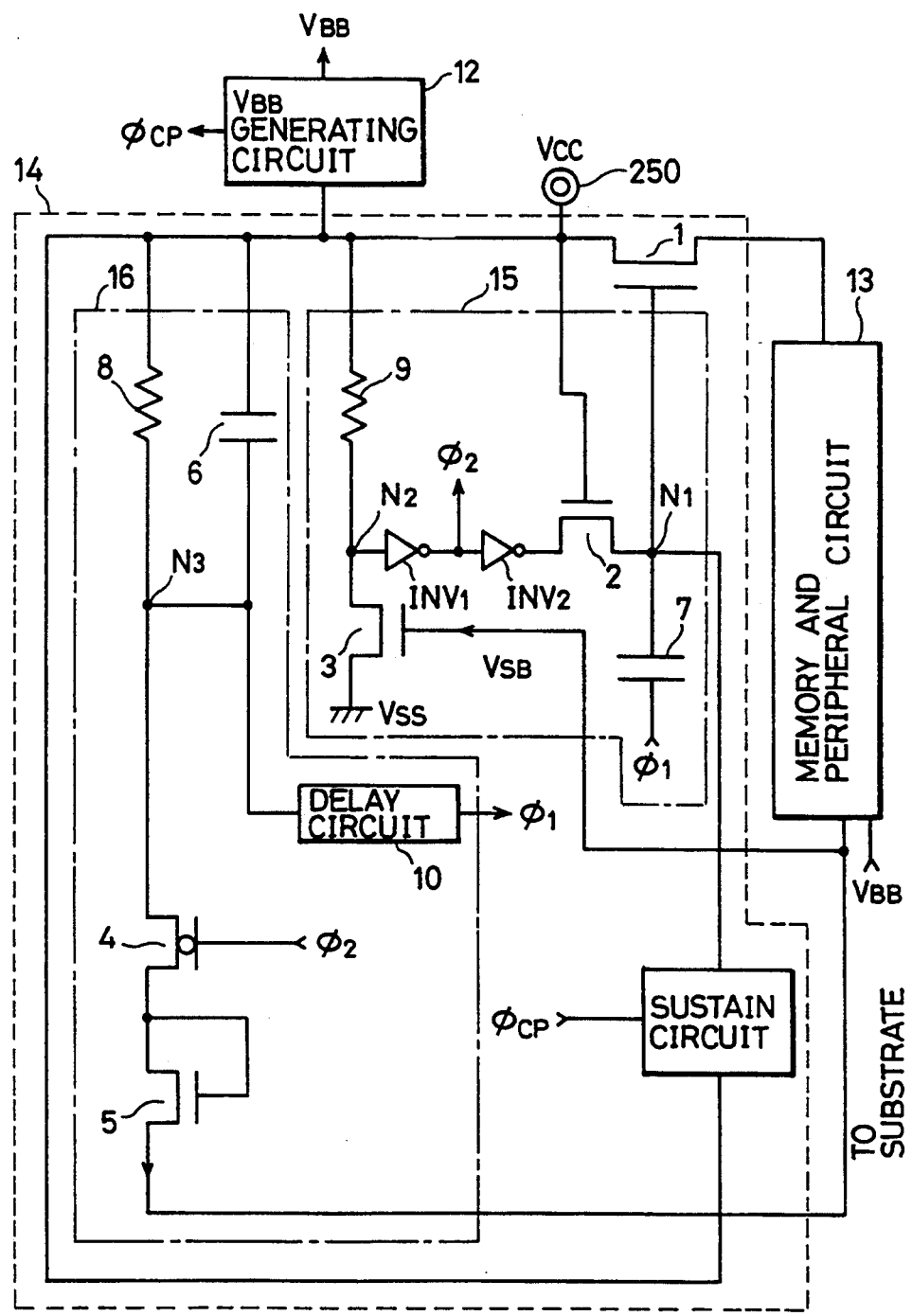
FIG. 1 is a circuit diagram showing a structure of a semiconductor protecting circuit of one embodiment of the present invention.

FIG. 1 is a circuit diagram showing a structure of a semiconductor protecting circuit of one embodiment of the present invention. FIG. 1 shows a case where a semiconductor protecting circuit according to the present invention is applied to a semiconductor storage device.

Referring to FIG. 1, a semiconductor protecting circuit 14 is provided so as to protect an internal circuit 13 of a semiconductor storage device, such as a memory portion including a plurality of memory cells (not shown) and a peripheral circuit portion for performing data write or data read to the memory portion, from destruction due to continuation of latch-up.

A substrate bias voltage generating circuit 12 includes a ring oscillator (not shown). Substrate bias voltage generating circuit 12 is driven by power supply voltage Vcc and generates a substrate bias voltage $V_{BB}$ in response to an output of the ring oscillator. The generated substrate bias voltage $V_{BB}$ is applied to a P type semiconductor substrate where internal circuit 13 and substrate bias voltage generating circuit 12 are formed.

A semiconductor protecting circuit 14 is driven by the same power supply voltage Vcc as an internal circuit 13 and substrate bias voltage generating circuit 12 are driven by, and operates in response to an output $\phi_{CP}$ of the ring oscillator within a substrate bias voltage generating circuit 12 and an actual potential $V_{SB}$ of the P type semiconductor substrate where internal circuit 13 is formed.

Semiconductor protecting circuit 14 comprises an N channel MOS transistor 1 provided between power supply pad 250 and internal circuit 13 for electrically coupling and cutting off power supply voltage Vcc and internal circuit 13, and control circuits 15 and 16 for controlling transistor 1.

Control circuit 15 comprises a high resistor 9 and an N channel MOS transistor 3 connected to each other in series between power supply pad 250 and ground; an inverter INV1 inverting a potential of a connecting point N2 of a resistor 9 and transistor 3; an inverter INV2 inverting an output of inverter INV1; an N channel MOS transistor 2 and capacitor 7 connected to each other in series between an output terminal of inverter INV2 and an output terminal of a delay circuit 10.

Power supply voltage Vcc is applied to the gate of transistor 2. A potential of a connecting point N1 of transistor 2 and capacitor 7 is applied to the gate of transistor 1.

Control circuit 16 comprises the delay circuit 10; a high resistor 8, a P channel MOS transistor 4 and a diode-connected N channel MOS transistor 5 which are connected to each other in series; and a capacitor 6 connected to resistor 8 in parallel.

A series connecting circuit of resistor 8, transistors 4 and 5 is provided between power supply pad 250 and a P type region (See FIG. 5) having a high impurity concentration in a P type substrate where internal circuit 13 is formed. An output signal $\phi_2$ of inverter INV1 is applied to the gate of transistor 4. Delay circuit 10 includes, for example, an inverter, and inverts a potential change of a connecting point N3 of resistor 8 and transistor 4 and then transmits the inverted potential change to a succeeding element with a predetermined delay. An output signal $\phi_1$ of delay circuit 10 is applied to one of the electrodes of capacitor 7.

Semiconductor protecting circuit 14 further comprises a sustain circuit 11. Sustain circuit 11, which is driven by power supply voltage Vcc, is provided so as to keep a potential of node N1 high in response to output $\phi_{CP}$ of the ring oscillator within substrate bias generating circuit Referring to FIGS. 1 and 3, operation of semiconductor protecting circuit 14 will be described.

Figure 3:
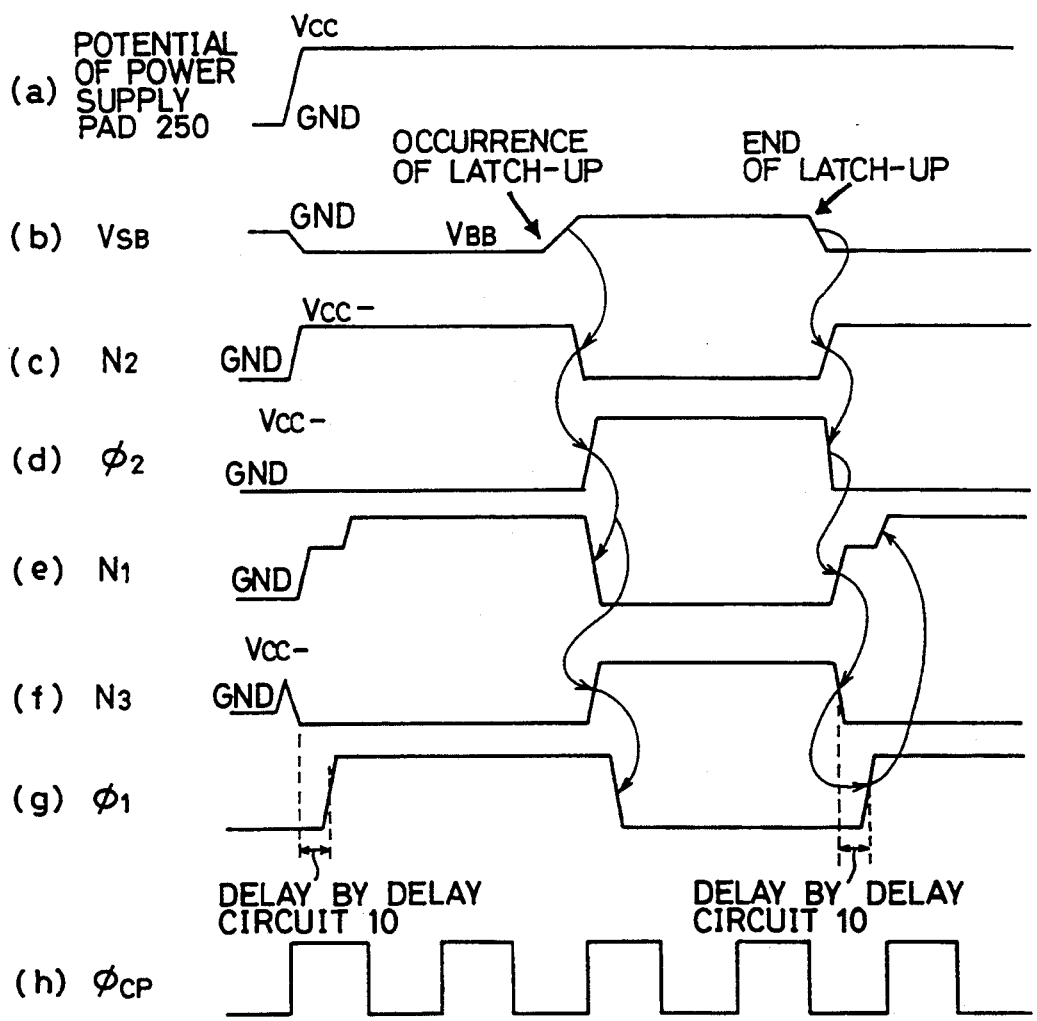
FIG. 3 is a timing chart for describing operation of the semiconductor protecting circuit shown in FIG. 1.

FIG. 3 is a timing chart showing potential changes of each portion of semiconductor protecting circuit 14 in FIG. 1 when latch-up is caused in internal circuit 13.

When power is supplied to power supply pad 250 and a potential (FIG. 3 (a)) of power supply pad 250 reaches a prescribed potential Vcc, transistor 2 is turned on, so that the potential of node N1 is determined by an output potential of inverter INV2.

Meanwhile, substrate bias voltage generating circuit 12 operates to output a negative substrate bias voltage $V_{BB}$ in response to the supplied power. Potential $V_{SB}$ of the P type substrate where internal circuit 13 is formed is forced to fall below the ground potential by substrate bias voltage $V_{BB}$ in response to the supplied power, as shown in FIG. 3(b).

Since transistor 3 is held OFF immediately after power is supplied, node N2 is charged by electric charges supplied from power supply pad 250 through resistor 9. As a result, a potential of node N2 attains a high level in response to the supplied power as shown in FIG. 3(c).

When the potential of node N2 is at a high level, an output of inverter INV1, namely, signal $\phi_2$ is at a low level, so that transistor 4 in control circuit 16 is turned on. Power supply voltage Vcc is supplied to transistor 5 through resistor 8 and transistor 4, and transistor 5 is also turned on. As a result, electric charges are discharged from node N3 to the substrate through transistors 4 and 5, and thus a potential of node N3 (FIG. 3(f)) attains a low level close to the level of substrate potential $V_{SB}$ in response to the supplied power.

Immediately after the power is supplied, since a gate potential of transistor 5 does not reach the threshold voltage of transistor 5, transistor 5 is held off. As a result, a potential of node N3 reaches a high level, since electric charges are supplied from power supply pad 250 to node N3 through resistor 8. Delay circuit 10 is constituted so as to output a potential of a low level, when the potential of node N3 is at a high level immediately after power is supplied. Thus, an output potential $\phi_1$ of delay circuit 10 is at a low level immediately after power is supplied, and reaches a high level a predetermined time after transistor 5 is turned on and the potential of node N3 reaches a low level.

As described above, immediately after power is supplied, the potential of signal $\phi1$ is at a low level (ground potential), so that the potential of node N1 equals to an output potential of transistor 2. The output potential of transistor 2 is lower (Vcc-Vth) than a gate potential Vcc by a threshold voltage Vth of transistor 2 since the output potential of inverter INV2 is at a high level.

When the potential of node N3 attains a low level immediately after power is supplied and thus the potential of signal $\phi1$ attains a high level, since the potential of signal $\phi1$ is higher (Vcc) than a potential (Vcc-Vth) which transistor 2 is to apply to node N1, the potential of node N1 becomes slightly higher (Vcc-Vth+$\alpha$) than the potential which transistor 2 is to apply to node N1 by coupling of capacitor 7.

Thereafter, unless substrate potential $V_{SB}$ is a potential corresponding to the threshold voltage of transistor 3 or above, the potential of node N2 does not fall and therefore levels of the potentials of signals $\phi1$ and $\phi2$ do not change. Hence, as shown in FIG. 3(e), the potential of node N1 becomes higher than a potential which is lower than power supply potential Vcc by the threshold voltage Vth of transistor 2 after power is supplied. Thereafter the potential of node N1 is kept at the potential (Vcc-Vth+$\alpha$) unless substrate potential $V_{SB}$ is the potential corresponding to the threshold voltage of transistor 3 or above.

When node N1 has such a high potential (Vcc-Vth+$\alpha$), transistor 1 is turned on and power supply pad 250 is electrically connected to internal circuit 13. Therefore, when substrate potential $V_{SB}$ is the threshold voltage of transistor 3 or below, internal circuit 13 is driven by external power supply voltage Vcc to operate.

The ring oscillator in substrate bias voltage generating circuit 12 generates a rectangular wave having a constant frequency as shown in FIG. 3(h). When the potential of node N1 reaches a potential (Vcc-Vth+$\alpha$), sustain circuit 11 operates to compensate the potential of node N1 in response to a rise or a fall of output potential $\phi_{CP}$ of the ring oscillator so as to keep the potential of node N1 at the potential (Vcc-Vth+$\phi$).

Assume that latch-up is caused in internal circuit 13 for some reason when internal circuit 13 is under driven by power supply voltage Vcc applied through transistor 1 for operation.

Figure 5:
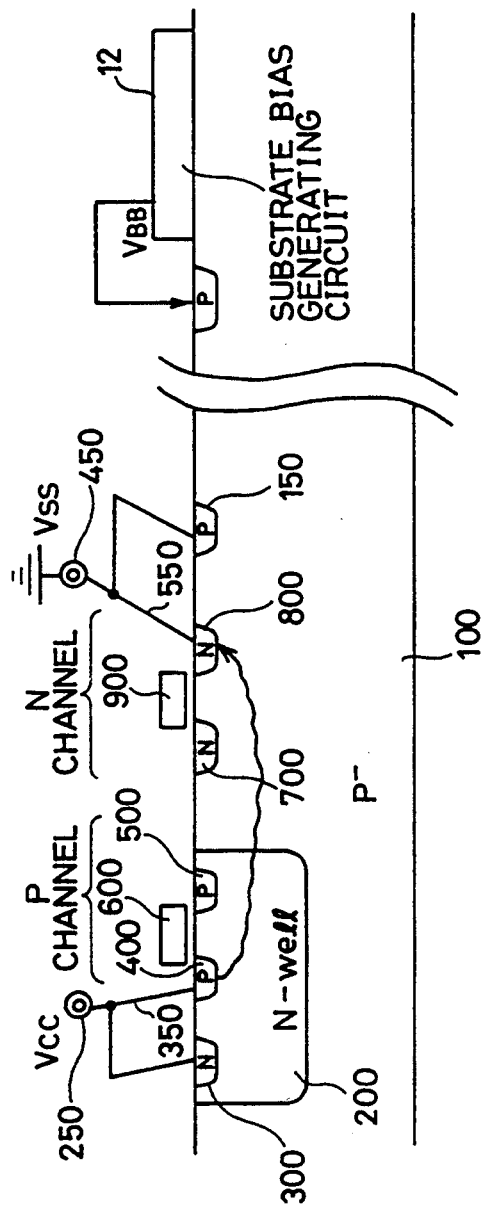
FIG. 5 is a sectional view for describing a mechanism in which latch-up is caused in a semiconductor integrated circuit device.

Referring to FIG. 5, when latch-up is caused, holes flow out of, for example, N well 200 in P type substrate 100 where internal circuit 13 is formed. Potential $V_{SB}$ of substrate 100 rises from substrate bias voltage $V_{BB}$ as shown in FIG. 3(b). When substrate potential $V_{SB}$ exceeds the threshold voltage of transistor 3, transistor 3 is turned on and electric charges of node N2 are discharged to ground. As a result, the potential of node N2 falls almost to ground potential $V_{ss}$ as shown in FIG. 3(c).

When the potential of node N2 attains a low level, output potential $\phi_2$ of inverter INV1 attains a high level and transistor 4 is turned off in control circuit 16. A discharging path of electric charges of node N3 is cut off and therefore the potential of node N3 reaches a high level, as shown in FIG. 3(f), since electric charges are supplied from power supply pad 250 to resistor 8 through node N3.

Since such a potential change of node N3 appears in the potential of signal $\phi1$ after a delay time of delay circuit 10, the potential of signal $\phi1$ falls to a low level after a predetermined time from a time of a rise of the potential of node N3.

When the potential of node N2 attains a low level, the output potential of inverter INV2 also attains a low level. Therefore, when substrate potential $V_{SB}$ exceeds the threshold voltage of transistor 3, capacitor 7 is not charged any more and the potential of node N1 falls to a low level as shown in FIG. 3(e).

When the potential of node N1 reaches a low level, transistor 1 is turned off and power supply pad 250 is electrically cut off from internal circuit 13, so that power supply voltage Vcc is no longer supplied to internal circuit 13.

Thus, when substrate potential $V_{SB}$ becomes higher than the threshold voltage of transistor 3 because of latch-up caused in internal circuit 13, transistor 1 is automatically turned off and interrupts supplying power supply voltage Vcc to internal circuit 13.

Referring to FIG. 5, if a current starts to flow, for example, from P type region 400 receiving power supply voltage Vcc to N type region 800 connected to ground through N well 200 and P type substrate 100 because of latch-up, the current keeps flowing as long as power supply voltage Vcc is supplied to P type region 400.

In the present embodiment, however, if such latch-up is caused, power supply pad 250 is electrically cut off from the internal circuit formed on P type substrate 100. This means that power supply voltage Vcc is not supplied to P type region 400. Therefore, when a current due to the latch-up flows from P type region 400 to N type region 800 through substrate 100 and potential $V_{SB}$ of substrate 100 reaches the threshold voltage of the MOS transistor, supply of power supply voltage Vcc to P type region 400 is interrupted and the current no longer flows from P type region 400 to N type region 800.

Consequently, according to the present embodiment, even if latch-up is caused in internal circuit 13 in FIG. 1, the current due to latch-up does not keep flowing into P type substrate where internal circuit 13 is formed, so that the semiconductor storage device including internal circuit 13 is protected from being heated and destructed.

When power supply voltage Vcc is not supplied to internal circuit 13 and the current due to latch-up is interrupted flowing in the substrate where internal circuit 13 is formed, substrate potential $V_{SB}$ start to fall as shown in FIG. 3(b). Substrate bias voltage generating circuit 12 keeps operating with power supply voltage Vcc, so that negative voltage VBB is kept being applied to the substrate. Therefore, substrate potential $V_{SB}$ recovers again to the same potential as substrate bias voltage $V_{BB}$.

When substrate potential $V_{SB}$ falls to the previous potential, transistor 3 of control circuit 15 is turned off again and the potential of node N2 rises to a high level as shown in FIG. 3(c).

In response to the rise of the potential of node N2, output potential $\phi_2$ of inverter INV1 falls to a low level, as shown in FIG. 3(d), so that transistor 4 of control circuit 16 is turned on again.

When transistor 4 is turned on and the gate voltage of transistor 5 rises to the threshold voltage of transistor 5 or above, transistor 5 is also turned on, so that the potential of node N3 attains a low level as shown in FIG. 3(f).

However, the potential change of node N3 is inverted and delayed by delay circuit 10. As a result, the potential of signal $\phi 1$ reaches a high level after a delay time of delay circuit 10 from a time of the fall of the potential of node N3.

In response to the potential of node N2 reaching a high level, the output potential of inverter INV2 reaches a high level as shown in FIG. 3(c). Capacitor 7 is then charged again during a period from the time of the rise of the potential of node N3 to the time when a delay time of delay circuit 10 is elapsed, that is, during a period when the potential of signal $\phi 1$ is at a low level. As a result, during this period, the potential of node N1 is made to be lower (Vcc-Vth) than power supply voltage Vcc by threshold voltage Vth of transistor 2 because of the output potential of inverter INV2.

Thereafter, when the potential of signal $\phi 1$ attains a high level, the potential of node N1 slightly increases from the potential (Vcc-Vth) to a potential (Vcc-Vth+$\alpha$) by coupling of capacitor 7. (See FIG. 3(e)).

When the potential of node N1 rises to the potential (Vcc-Vth+$\alpha$) as described above, sustain circuit 11 operates again to keep the potential of node N1 at this potential.

Even when supply of power supply voltage Vcc to internal circuit 13 is interrupted because of latch-up in internal circuit 13, the potential of node N1 rises again if, thereafter, internal circuit 13 is freed from a latch-up state and substrate potential $V_{SB}$ recovers to a normal potential. Transistor 1 is then turned on again and starts supplying power supply voltage Vcc to internal circuit 13. Internal circuit 13 is driven by power supply voltage Vcc and resumes operation as it was before the latch-up is caused.

When power supply pad 250 and internal circuit 13 are electrically connected, the potential of node N1 is kept slightly higher than a potential which is lower than power supply voltage Vcc by threshold voltage Vth of the MOS transistor so that a voltage supplied to internal circuit 13 by transistor 1 has almost the same magnitude as power supply voltage Vcc. That is, the potential of node N1 is raised (boosted) to a potential higher than the outpost potential of transistor 2 by signal $\phi 1$ at a high level, whereby power supply voltage Vcc is supplied to internal circuit 13 without voltage drop.

In the above embodiment, signal $\phi 1$ applied to capacitor 7 is produced by control circuit 16 operating in response to output signal $\phi 2$ of inverter INV1 in order to raise the gate potential of transistor 1 (the potential of node N1) supplying power supply voltage Vcc to internal circuit 13 to such a high potential. However, a method of producing such a control signal $\phi 1$ is not limited to the one shown in the above embodiment, but any method is appropriate as long as a signal can be produced which is kept at a low level for a while in order to charge node N1 even after internal circuit 13 is freed from a latch-up state and thereafter rises to power supply voltage Vcc.

Figure 2:
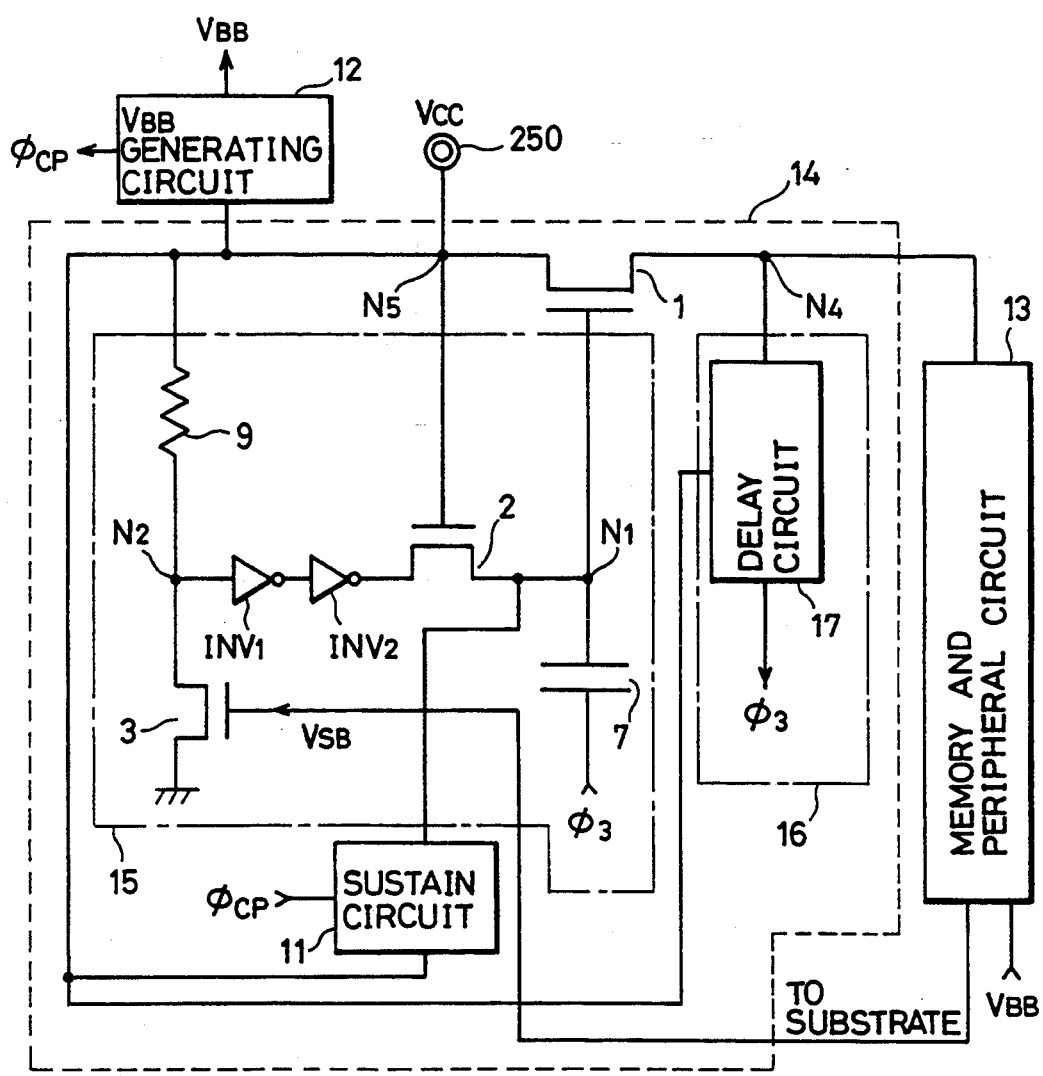
FIG. 2 is a circuit diagram showing a structure of a semiconductor protecting circuit of another embodiment of the present invention.

FIG. 2 is a circuit diagram showing a structure of a semiconductor protecting circuit wherein a control signal $\phi 1$ is produced in a manner different from that of the above embodiment and shows another embodiment of the present invention.

FIG. 2 shows in a case where a semiconductor protecting circuit applied to a semiconductor storage device according to the present invention.

Referring to FIG. 2, as in the above embodiment, the semiconductor protecting power supply pad 250 comprises N channel MOS transistor 1 provided between power supply pad 250 and internal circuit 13 of a semiconductor storage device, control circuits 15 and 16 for controlling transistor 1 and sustain circuit 11.

Structures and operations of sustain circuit 11 and control circuit 15 in semiconductor protecting circuit 14 of the present embodiment are the same as those of the circuits shown in FIG. 1, and the description is not repeated. A control signal $\phi 3$ in FIG. 2 corresponds to control signal $\phi 1$ in FIG. 1.

Unlike the above embodiment, control circuit 16 includes a delay circuit 17 connected to a connecting point N4 of transistor 1 and internal circuit 13.

Delay circuit 17, together with internal circuit 13 of the semiconductor storage device and a substrate bias voltage generating circuit 12, is driven by power supply voltage Vcc and delays a potential change of node N4 a predetermined time without inversion. Signal $\phi 3$ delayed by delay circuit 17 is applied to one electrode of capacitor 7 within control circuit 15.

Figure 4:
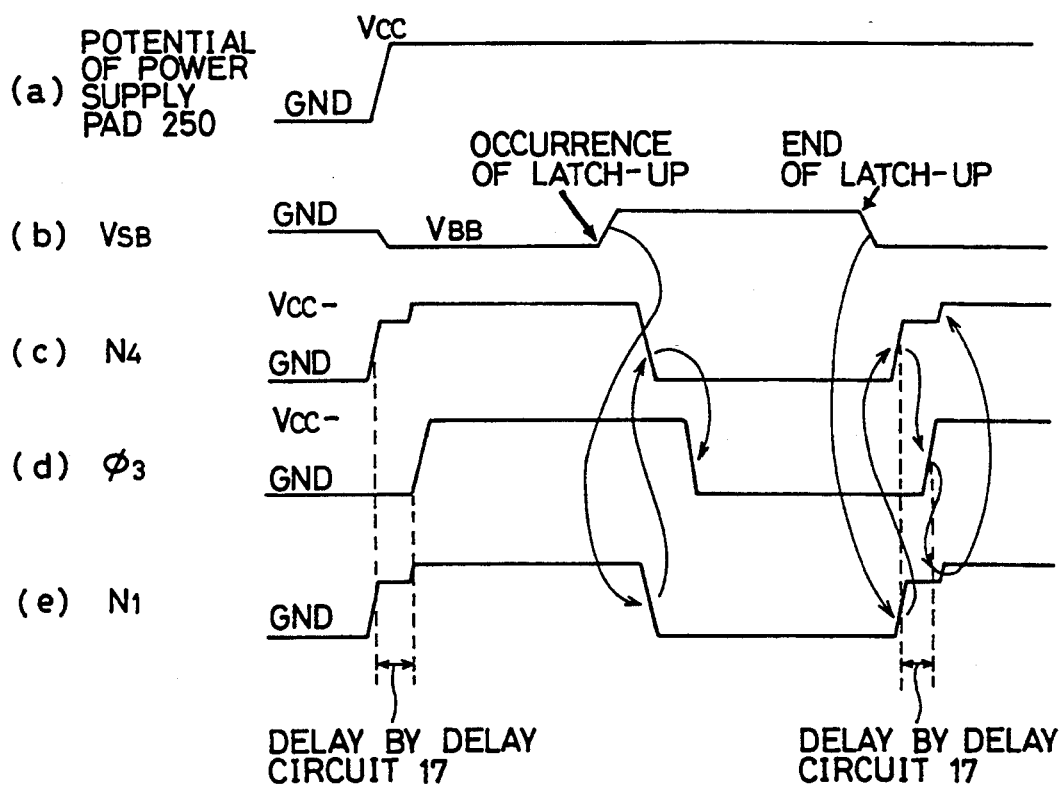
FIG. 4 is a timing chart for describing operation of the semiconductor protecting circuit shown in FIG. 2.

Referring to FIGS. 2 and 4, operation of control circuit 16 will be described.

FIG. 4 is a timing chart showing potential changes of portions which relate to the operation of control circuit 16 when latch-up is caused in internal circuit 13.

When power is supplied to power supply pad 250 and a potential of power supply pad 250 (FIG. 4(a)) rises to a high level, transistor 2 is turned on and the output signal of inverter INV2 is applied to node N1.

Since a potential of node N4 is at a low level before power is supplied, an output potential $\phi 3$ of delay circuit 17 (FIG. 4(d)) is at a low level immediately after power is supplied. In response to the supplied power, capacitor 7 is charged, so that the potential of node N1 rises to a potential (Vcc-Vth) lower than power supply potential Vcc by threshold voltage Vth of transistor 2.

In response, transistor 1 is turned on and the potential of node N4 (FIG. 4(c)) rises in response to the supplied power. However, the potential change of node N4 appears after a delay time of delay circuit 17 in signal $\phi 3$. That is, the potential of signal $\phi 3$ rises after a predetermined time from the time of the rise of the potential of node N4 as shown in FIG. 4(d).

When the potential of signal $\phi 3$ attains a high level, the potential of node N1 further rises by coupling of capacitor 7, as shown in FIG. 4(e).

The rise of the potential of node N1 means a rise of the gate potential of transistor 1, and hence in response to the rise of the potential of node N1 the potential of node N4 further rises as shown in FIG. 4(c). As in the above embodiment, when the potential of node N1 rises, sustain circuit 11 operates to compensate the potential after the rise. Therefore, the potential of node N4 is raised to almost the same potential as power supply potential Vcc in response to the supplied power and kept at this potential unless the potential of node N1 falls. That is, power supply voltage Vcc is kept being supplied to internal circuit 13 without voltage drop.

Thereafter, when latch-up is caused in internal circuit 13 and potential $V_{SB}$ of the substrate where internal circuit 13 is formed exceeds the threshold voltage of transistor 3, the potential of node N1 falls after shown in FIG. 4(e) in response to a fall of the potential of node N2.

When the potential of node N1 reaches a low level, transistor 1 is turned off and the potential of node N4 falls as shown in FIG. 4(c). The potential of signal $\phi 3$ falls after a predetermined time of delay circuit 17 from the fall of the potential of node N4.

When potentials of signal $\phi 3$ and node N1 attain a low level as described above, electric charges are discharged from capacitor 7 and the potential of node N1 is stabilized to be at a low level. As a result, transistor 1 is stabilized to be off and a current due to latch-up stops flowing in internal circuit 13 and then substrate potential $V_{SB}$ (FIG. 4(b)) recovers to substrate bias voltage $V_{BB}$.

When substrate voltage $V_{SB}$ attains a low level, the potential of node N2 reaches a high level and the potential of node N1 rises, as they do when power is applied to the pad 250. In response, transistor 1 is turned on to supply power supply voltage Vcc to node N4.

The rise of the potential of node N4 appears in signal $\phi 3$ with a predetermined time delay caused by delay circuit 17, and hence the potential of node N1 rises to a potential lower than power supply voltage Vcc by threshold voltage Vth of transistor 2 because of charge of capacitor 7 during a time period which corresponds to a delay time of delay circuit 17 after substrate potential $V_{SB}$ falls and further rises by coupling of capacitor when the potential of signal $\phi 3$ attains a high level a delay time of delay circuit 17 after the fall of substrate potential $V_{SB}$, as shown in FIG. 4(e).

Therefore, the potential of node N4, as shown in FIG. 4(c), once rises to a potential slightly lower than power supply potential Vcc in response to the fall of substrate potential $V_{SB}$ and thereafter further rises to a potential almost the same as power supply potential $V_{CC}$ in response to the rise of the potential of signal $\phi 3$.

As described above, also in this embodiment, when substrate potential $V_{SB}$ rises because of latch-up in internal circuit 13, transistor 1 is turned off and supply of power supply potential Vcc to internal circuit 13 is interrupted, thereafter, internal circuit 13 is freed from the latch-up state, so that substrate potential $V_{SB}$ falls, and transistor 1 is then turned on to resume supplying power supply voltage Vcc to internal circuit 13.

The present invention is applicable not only to a semiconductor storage device but also to a semiconductor device in general.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor protecting apparatus for protecting a circuit formed on a semiconductor substrate and driven by a predetermined external voltage for operating from an influence of latch-up caused in said semiconductor substrate, comprising:

an external terminal receiving said external voltage;

a substrate potential detecting means for detecting a potential of said semiconductor substrate being higher than a predetermined potential, said substrate potential detecting means comprising a first node electrically coupled to said external terminal, a first switching means electrically connecting said first node to a predetermined low potential source when the potential of said semiconductor substrate is in a first range and electrically cutting off said first node from said predetermined low potential source when the potential of said semiconductor substrate is in a second range, wherein a potential of said first node is used as a detection output, and wherein said first switching means comprises a field effect semiconductor element having a first conductive terminal connected to said predetermined low potential source, a second conductive terminal connected to said first node and a control terminal receiving the potential of said semiconductor substrate; and a voltage supply interrupting means responsive to the detection output of said substrate potential detecting means for interrupting the supply of said predetermined external voltage to said circuit.

2. The semiconductor protecting apparatus according to claim 1, wherein said first range is a range of potentials higher than said predetermined potential, and said second range is a range of potentials lower than said predetermined potential.

3. The semiconductor protecting apparatus according to claim 1, wherein said voltage supply interrupting means comprises second switching means connected between said external terminal and said circuit for turning on/off in response to the potential of said first node.

4. The semiconductor protecting apparatus according to claim 3, wherein said second switching means comprises a field effect semiconductor element having a first conductive terminal connected to said external terminal, a second conductive terminal connected to said circuit and a control terminal coupled to said first node.

5. A semiconductor protecting apparatus for protecting a circuit formed on a semiconductor substrate and driven by a predetermined external voltage for operating from an influence of latch-up caused in said semiconductor substrate, comprising:

an external terminal receiving said external voltage;

a substrate potential detecting means for detecting a potential of said semiconductor substrate being higher than a predetermined potential, said substrate potential detecting means comprising a first node electrically coupled to said external terminal, a first switching means electrically connecting said first node to a predetermined low potential source when the potential of said semiconductor substrate is in a first range and electrically cutting off said first node from said predetermined low potential source when the potential of said semiconductor substrate is in the second range, wherein a potential of said first node is used as said detection output; and a voltage supply interrupting means responsive to a detection output of said substrate potential detecting means for interrupting supply of said predetermined external voltage to said circuit, wherein said voltage supply interrupting means comprises second switching means connected between said external terminal and said circuit for turning on/off in response to the potential of said first node, wherein said second switching means comprises a field effect semiconductor element having a first conductive terminal connected to said external terminal, a second conductive terminal connected to said circuit and a control terminal coupled to said first node, and wherein a conductivity type of said field effect semiconductor element is an N type and said voltage supply interrupting means further comprises potential controlling means responsive to a rise of a potential of said first node for lowering a potential of said control terminal and responsive to a fall of the potential of said first node for raising the potential of said control terminal.

6. The semiconductor protecting apparatus according to claim 5, wherein said potential controlling means comprises a second node connected to said control terminal and an electric path means for transmitting a potential change of said first node to said second node when said external voltage is applied to said external terminal.

7. The semiconductor protecting apparatus according to claim 6, further comprising a capacitance coupling means connected to said second node; and charging means for charging said capacity coupling element only when the potential of said first node is in said first range.

8. The semiconductor protecting apparatus according to claim 7, wherein said charging means comprises a third node coupled to said external terminal, third switching means responsive to a fall of a potential of said first node for electrically cutting off said third node from said semiconductor substrate and responsive to a rise of a potential of said first node for electrically connecting said third node to said semiconductor substrate, and delaying means for applying a potential change of said third node to said capacity coupling element with a predetermined time delay.

9. The semiconductor protecting apparatus according to claim 7, wherein said second switching means is connected to said circuit through a predetermined node, and said charging means comprises delaying means for applying a potential change of said predetermined node to said capacity coupling element with a predetermined time delay.

10. The semiconductor protecting apparatus according to claim 8, wherein said third switching means comprises a third field effect semiconductor element having a first conductive terminal connected to said third node, a second conductive terminal connected to said semiconductor substrate and a control terminal coupled to said first node.

11. The semiconductor protecting apparatus according to claim 8, wherein said capacity coupling element comprises a capacitor having a first electrode connected to said second node, and a second electrode receiving a signal delayed by said delay means.

12. The semiconductor protecting apparatus according to claim 9, wherein said third switching means comprises a third field effect semiconductor element having a first conductive terminal connected to said third node, a second conductive terminal connected to said semiconductor substrate and a control terminal coupled to said first node.

13. The semiconductor protecting apparatus according to claim 6, wherein said electric path means comprises a first inverter means inverting the potential of said first node second inverter means further inverting the signal inverted by said first inverter means, and a field effect semiconductor element having a first conductive terminal receiving the signal inverted by said second inverter means, a second conductive terminal connected to said second node and a control terminal connected to said external terminal.

14. The semiconductor protecting apparatus according to claim 5, further comprising means for keeping a potential of said control terminal after the potential has risen.

15. The semiconductor protecting apparatus according to claim 5, wherein said circuit is a memory circuit.

16. A semiconductor integrated circuit device, comprising:

function circuit means formed on a semiconductor substrate and driven by a predetermined external voltage for functioning; and protecting circuit means formed on said semiconductor substrate for protecting said function circuit from an influence of latch-up caused in said semiconductor substrate, wherein said protecting means comprises substrate potential detecting means for detecting a potential of said semiconductor substrate being higher than a predetermined potential, said substrate potential detecting means including a first node electrically coupled to an external terminal, a first switching means electrically connecting said first node to a predetermined low potential source when the potential of said semiconductor substrate is in a first range and electrically cutting off said first node from said predetermined low potential source when the potential of said semiconductor substrate is in a second range, wherein a potential of said first node is used as a detection output, and wherein said first switching means comprises a field effect semiconductor element having a first conductive terminal connected to said predetermined low potential source, a second conductive terminal connected to said first node and a control terminal receiving the potential of said semiconductor substrate; and voltage supply interrupting means responsive to the detection output of said substrate potential detecting means for interrupting supply of said predetermined external voltage to said circuit.

17. The semiconductor integrated circuit device according to claim 16, wherein said function circuit means is a memory circuit.

18. The semiconductor integrated circuit device according to claim 17, further comprising substrate bias means formed on said semiconductor substrate for applying a predetermined low potential to said semiconductor substrate.

19. A method of protecting a circuit formed on semiconductor substrate and driven by a predetermined external voltage for operating from an influence of latch-up caused in the semiconductor substrate, comprising the steps of:

generating a predetermined detection signal after detecting a potential of the semiconductor substrate being higher than a predetermined potential, said generating step comprising the steps of electrically connecting a first conductive terminal of a field effect semiconductor element to a predetermined low potential source;

electrically connecting a second conductive terminal of the field effect semiconductor element to a first node, a nodea potential of the first node being used as a detection output for the detection signal;

electrically connecting a control terminal of the field effect semiconductor element to the semiconductor substrate and applying a potential of the semiconductor substrate to the control terminal;

electrically connecting, via the field effect semiconductor element, the first node to the predetermined low potential source when the potential of the semiconductor substrate is in a first range; and electrically cutting off, via the field effect semiconductor element, the first node from the predetermined low potential source when the potential of the semiconductor substrate is in a second range; and interrupting supply of said predetermined external voltage to said circuit in response to said generated detection signal.

20. The method according to claim 19, further comprising the step of resuming supplying said predetermined external voltage to said circuit in response to said detection signal not being generated.

21. A semiconductor protecting apparatus for protecting a circuit formed on a semiconductor substrate and driven by a predetermined external voltage for operating from an influence of latch-up caused in said semiconductor substrate, comprising:

an external terminal receiving said external voltage;

a substrate potential detecting means for detecting a potential of said semiconductor substrate being higher than a predetermined potential, said substrate potential detecting means comprising:

a first node electrically coupled to said external terminal, a first switching means electrically connecting said first node to a predetermined low potential source when the potential of said semiconductor substrate is in a first range and electrically cutting off said first node from said predetermined low potential source when the potential of said semiconductor substrate is in the second range, and wherein a potential of said first node is used as a detection output;

voltage supply interrupting means response to the detection output of said substrate potential detecting means for interrupting supply of said predetermined external voltage to said circuit, wherein said voltage supply interrupting means comprises second switching means connected between said external terminal and said circuit for turning on/off in response to the potential of said first node, wherein said second switching means comprises a field effect semiconductor element having a first conductive terminal connected to said external terminal, a second conductive terminal connected to said circuit and a control terminal coupled to said first node, and wherein said voltage supply interrupting means further comprises potential controlling means responsive to a rise of potential of said first node for lowering a potential of said control terminal and responsive to a fall of the potential of said first node for raising the potential of said control terminal.

* * * * *